United States Patent [19]

Iwamatsu

[11] Patent Number: 5,119,170
[45] Date of Patent: Jun. 2, 1992

[54] THIN FILM METAL INTERCONNECTS IN INTEGRATED CIRCUIT STRUCTURES TO REDUCE CIRCUIT OPERATION SPEED DELAY

[75] Inventor: Seiichi Iwamatsu, Suwa, Japan

[73] Assignee: Seiko Epson Corp., Tokyo, Japan

[21] Appl. No.: 759,786

[22] Filed: Sep. 9, 1991

Related U.S. Application Data

[63] Continuation of Ser. No. 461,693, Jan. 8, 1990, abandoned.

[30] Foreign Application Priority Data

Jan. 12, 1989 [JP] Japan .................................. 1-5807

[51] Int. Cl.⁵ .............................................. H01L 23/48
[52] U.S. Cl. ........................................ 357/68; 357/71; 437/180
[58] Field of Search ............... 357/71, 68, 23.3, 71 R, 357/71 S, 59 K, 22 A, 22 R; 437/180, 195

[56] References Cited

U.S. PATENT DOCUMENTS

| | | | |
|---|---|---|---|
| 4,424,621 | 1/1984 | Abbas et al. | 357/68 |
| 4,513,310 | 4/1985 | Ohno et al. | 357/68 |
| 4,543,443 | 9/1985 | Moeller et al. | 357/71 |
| 4,612,083 | 9/1986 | Yasumoto et al. | 357/71 R |
| 4,630,094 | 12/1986 | Wiley et al. | 357/71 R |
| 4,725,566 | 2/1988 | Ngu et al. | 437/180 |
| 4,733,291 | 3/1988 | Levy et al. | 357/23.3 |
| 4,788,582 | 11/1988 | Yamamoto et al. | 357/71 S |
| 4,962,410 | 10/1990 | Kriman et al. | 357/22 |
| 4,994,868 | 2/1991 | Geissberger et al. | 357/22 |

FOREIGN PATENT DOCUMENTS

| | | | |
|---|---|---|---|
| 60-121764 | 6/1985 | Japan | 357/16 |
| 63-240045 | 10/1988 | Japan | 357/68 |

Primary Examiner—Andrew J. James
Assistant Examiner—Hung Xuan Dang
Attorney, Agent, or Firm—W. Douglas Carothers, Jr.

[57] ABSTRACT

A method of forming thin film metal interconnects employed in integrated circuit structures comprising the step of laying out the interconnects so that the patterned interconnects have a relationship of interconnect width, L, and interconnect spatial separation, S, so that $S > 1 \mu m > L$. In particular, line width, L, is equal to or less than 0.8 $\mu m$, spatial separation, S, is in the range of 1.0 $\mu m$ to 1.2 $\mu m$ and interconnect thickness, $T_{A1}$, is about 0.5 $\mu m$ thereby providing effective optimization in the amount of reduction in interconnect spatial capacitance resulting in increased operation speed of the integrated circuit structure.

2 Claims, 1 Drawing Sheet

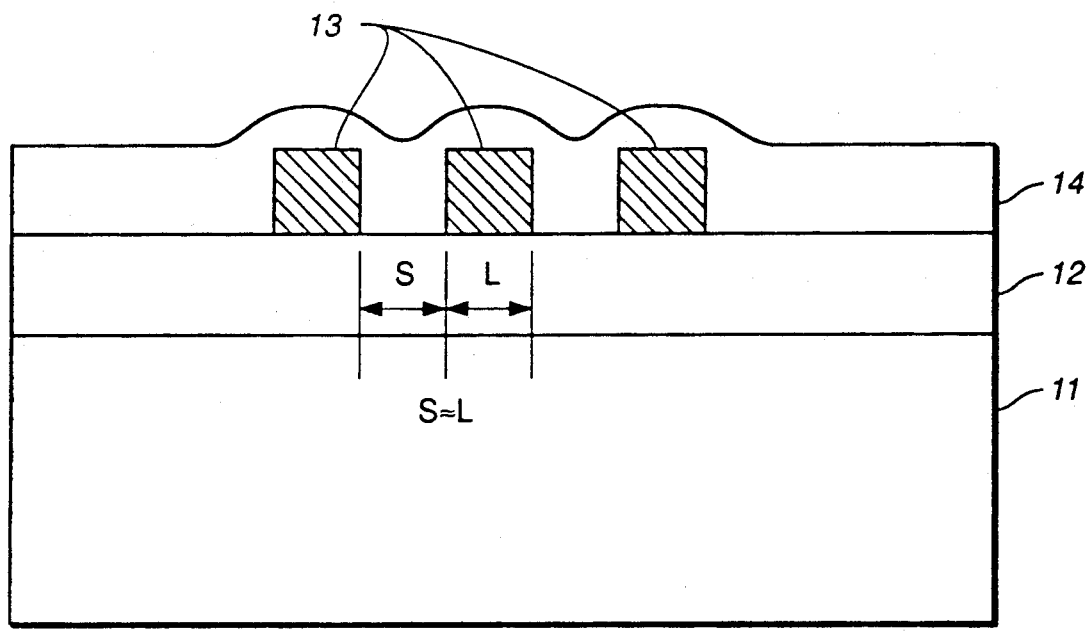
FIG._1
(PRIOR ART)
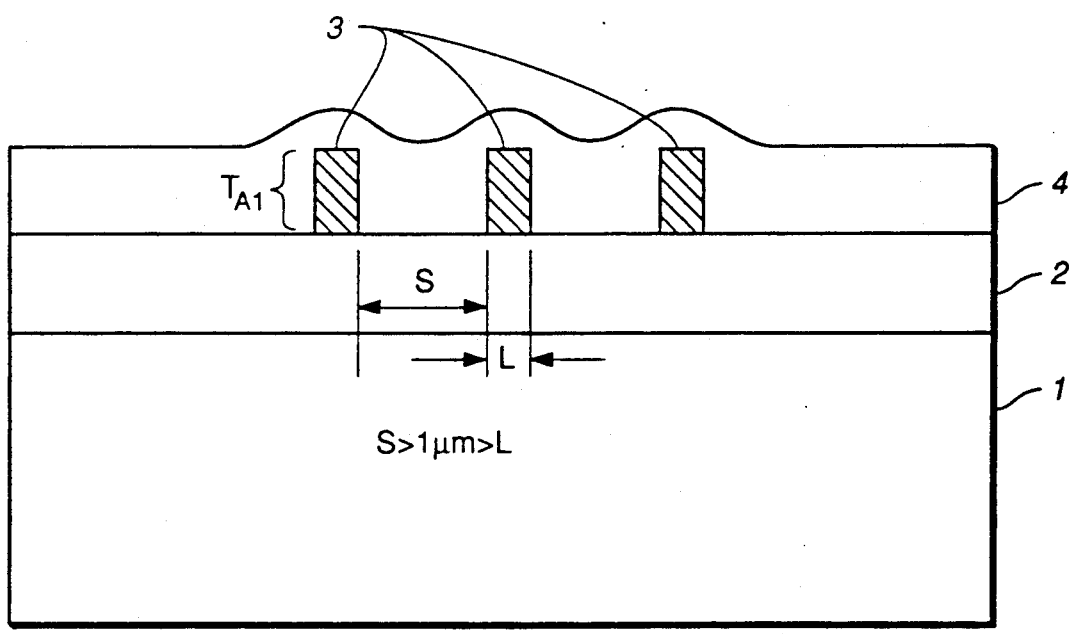
FIG._2

THIN FILM METAL INTERCONNECTS IN INTEGRATED CIRCUIT STRUCTURES TO REDUCE CIRCUIT OPERATION SPEED DELAY

This is a continuation of copending application Ser. No. 07/461,693 filed Jan. 8, 1991, now abandoned.

BACKGROUND OF THE INVENTION

This invention relates generally to a method of wiring line or metal interconnect design layout in integrated circuit structures and more particularly to the employment of an unique interconnect layout rule to reduce spatial interconnect capacitance thereby improving integrated circuit operation speed and performance.

It is the general practice in the fabrication of metal interconnects or electrode lines in integrated circuit structures to provide the finished measurements of lines, L, and spacing, S, to be approximately equal to each other, i.e., $L \approx S$. In current practice, this scale relationship in integrated circuit design has been 1 $\mu$m or less so that L plus S is equal to 2.0 $\mu$m or less. As an example, in FIG. 1, a portion of an integrated structure is shown and comprises insulating film 12, such as $SiO_2$, formed on Si semiconductor substrate 11. Thin film metal interconnects 13 comprising Al, Al alloy or the like are formed on the $SiO_2$ film 12. The relation among the interconnects 13 is of substantially equal width, L, and spatial separation, S, i.e., $L \approx S$. Lastly, an insulating film 14, such as $SiO_2$ formed by CVD, is deposited on interconnects 13 to function as an interlayer dielectric or passivation film. In integrated circuit structures such as shown in FIG. 1 are generally designed according to applicable minimum and maximum design layout rules wherein the spatial separation of metal interconnects is usually determined by the smallest spacing that can be patterned into the metalization.

In these prior art interconnect structures there exists the problem of delay in circuit operation speed due to the increase in number of interconnects as well as the density thereof because of reduced integration scale. In particular, as the integration scale has increasingly become smaller, the measurements of interconnect width and spatial separation are each equal to or less than 1 $\mu$m. As a result, spatial capacitance of interconnects significantly increases and becomes a dominant factor affecting signal propagation delay and switching speed of integrated circuits. Interconnect capacitance has a major effect on operation speed of logic circuitry since it functions as a load. As a result, there is an increase in signal delay or signal propagation delay time and a reduction in signal switching time due to these interconnects. What is needed is a new approach to forming metal interconnects to reduce this increase in capacitance load caused by large scale integration into the submicron range together with increases in interconnect density.

It is an object of the present invention to provide a layout method for thin film metal interconnects in integrated circuit structures without experiencing an increase in circuit operation speed delay, even in the case where the width of the interconnects is equal to or less than 1 $\mu$m.

SUMMARY OF THE INVENTION

According to this invention, a method for thin film metal interconnect layout in integrated circuit structures to reduce operation speed delay is disclosed wherein the width measurements for lines, L, and spacing, S, for interconnects are $S > 1\mu m > L$ and, more particularly, $L \leq 0.8$ $\mu$m and $1.0$ $\mu m \leq S \leq 1.2$ $\mu$m. By incorporating the layout rule of this invention, particularly in the submicron range of large scale integration, circuit operation speed delay, which is always associated with design rule scaling of integrated circuit devices and structural components, may be substantially reduced, if not effectively eliminated, providing high density and high speed integrated circuit structures.

Thus, this invention comprises a method of forming thin film metal interconnects employed in integrated circuit structures comprising the step of laying out the interconnects so that the patterned interconnects have a line width, L, equal to or less than 0.8 $\mu$m, spatial separation, S, in the range of 1.0 $\mu$m to 1.2 $\mu$m, preferably above 1.0 $\mu$m, and interconnect thickness, $T_{Al}$, of about 0.5 $\mu$m, thereby optimizing the amount of reduction in spatial capacitance between interconnects in the submicron integration scale regime, thereby resulting in an optimized improvement in the operation speed of the integrated circuit structure.

Other objects and attainments together with a fuller understanding of the invention will become apparent and appreciated by referring to the following description and claims taken in conjunction with the accompanying drawings.

BRIEF DESCRIPTION OF THE DRAWINGS

FIG. 1 is a cross sectional view of a portion of an integrated circuit structure illustrating the employed standard interconnect layout rule of $L \approx S$.

FIG. 2 is a cross sectional view of a portion of an integrated circuit structure illustrating the novel interconnect layout rule of this invention.

DESCRIPTION OF THE PREFERRED EMBODIMENTS

Reference is now made to FIG. 2 which illustrates a portion of a semiconductor integrated circuit structure to illustrate the interconnect layout rule of this invention. In FIG. 2, the integrated circuit structure comprises insulating film 2, such as $SiO_2$, formed on the surface of Si semiconductor substrate 1. Then, thin film metal interconnects 3 comprising, for example, Al, W or Cu, are formed on the surface of $SiO_2$ film 2 such as by conventional processing techniques, for example, depositing a first layer of metal, photopatterning the metal and etching the metal to form interconnects 3. Interconnects 3 have a width, L, and a spatial separation or spacing, S, according to the following characteristics: $S > 1\mu m < L$. More particularly, the layout rule is characterized by $L \leq 0.8$ $\mu$m and $1.0$ $\mu m \leq S \leq 1.2$ $\mu$m.

interconnects 3 are, then, covered with an insulating film 4, such as $SiO_2$, which may be deposited by CVD. Film 4 functions as an interlayer dielectric isolation or passivation film, as previously described.

Interconnect width, L, need not always be specifically between but is preferably between 0.1 $\mu$m and 0.8 $\mu$m. L may be larger but is not larger than 1.0 $\mu$m. The layout rule must take into consideration multilayer interconnection. When L becomes larger than 1.0 $\mu$m, spatial capacitance between a silicon substrate and an upper layer interconnect, for example, becomes larger and propagation time, $t_p$, becomes longer. However, the spatial separation, S, is always either equal to, but preferably greater than 1.0 $\mu$m.

For better understanding of this invention, Table I below illustrates differences in signal switching speed in terms of frequency relative to the relationship between interconnect width, L, and interconnect spatial separation, S. Although signal switching speed differs depending upon the given driving voltage on the interconnects, the structure of the interconnects as well as the connected circuit components and their corresponding impedances, the following can be considered as a general guideline relative to these relationships. In Table I, X denotes a switching frequency under 10 MHz, Y denotes a switching frequency of 10 to 20 MHz and Z denotes a switching frequency over 20 MHz. Also, $T_{Al}$ denotes the thickness of the interconnect.

Signal switching speed is proportionate to a reciprocal number of the signal switching time or propagation delay time, $t_p$. The propagation delay time is expressed as follows:

$$t_p = C \cdot R$$

where C represents the capacitance of interconnects and R presents the resistance of interconnects. Capacitance, C, is proportionate to a reciprocal number of the spatial separation between interconnects 3, and an increase or decrease in spatial capacitance is directly proportional to a decrease or increase, respectively, in circuit delay. Resistance, R is proportionate to a reciprocal number of the cross sectional area of interconnects 3. Therefore, when design layout is considered in the submicron region of large scale integration, the magnitude of increase in capacitance, C, dominates over the magnitude of increase in resistance, R, and thereby reducing signal switching speed.

TABLE I

| Example No. | S (μm) | L (μm) | Signal Switching Speed | Thickness of Interconnects, $T_{Al}$ |
|---|---|---|---|---|
| 1 | 0.5 | 0.8 | X | $T_{Al}$ = 0.1-0.5 μm |
| 2 | " | 0.5 | Y | |
| 3 | " | 0.3 | Y | |
| 4 | " | 0.1 | Z | |
| 5 | 0.7 | 0.8 | X | $T_{Al}$ = 0.1-0.7 μm |
| 6 | " | 0.5 | Y | |
| 7 | " | 0.3 | Z | |
| 8 | " | 0.1 | Z | |
| 9 | 0.9 | 0.8 | X | $T_{Al}$ = 0.2-0.9 μm |
| 10 | " | 0.5 | Y | |
| 11 | " | 0.3 | Z | |
| 12 | " | 0.1 | Z | |
| 13 | 1.0 | 0.8 | Y | $T_{Al}$ = 0.2-1.0 μm |
| 14 | " | 0.5 | Y | |
| 15 | " | 0.3 | Z | |
| 16 | " | 0.1 | Z | |
| 17 | 1.1 | 0.8 | Y | $T_{Al}$ = 0.2-1.0 μm |
| 18 | " | 0.5 | Y | |
| 19 | " | 0.3 | Z | |
| 20 | " | 0.1 | Z | |
| 21 | 1.2 | 0.8 | Y | $T_{Al}$ = 0.2-1.0 μm |
| 22 | " | 0.5 | Z | |
| 23 | " | 0.3 | Z | |
| 24 | " | 0.1 | Z | |

Recently, anisotropy etching techniques have advanced sufficiently to enable the formation of interconnects with smaller width compared to their thickness, $T_{Al}$, thus enabling, for example, conditions for Example Nos. 3, 4, 7, and 8 in Table I to be accomplished in practical use. If spatial separation, S, between interconnects 3 is large, then capacitance, C, will become small, and signal switching times will become shorter with a corresponding increase in signal switching speed. If interconnect width, L, is small, capacitance, C, between the top and bottom surfaces of interconnects 3 will be reduced and, therefore, the signal switching speed will be increased. If the thickness, $T_{Al}$, of interconnects 3 is small, however, the capacitance between neighboring or adjacent interconnects will become smaller and, therefore, the signal switching speed will be increased. Further, interconnect resistance, R, increases as the cross sectional area of interconnects decreases, reducing signal switching speed. Therefore, in order not to decrease cross sectional area of interconnects 3 and thereby increase their resistance, it is preferred that the thickness, $T_{Al}$, of interconnects be retained around 0.5 μm. This is because high values of $T_{Al}$ or high ratio values of $T_{Al}/L$ provide for very thin and high interconnect structures which are difficult to fabricate or realize from a practical point of view under the present state of the art.

When the insulating film 4 is a $SiO_2$ film, the dielectric constant is about 3.9. In the case of use of a polyimide film 4, the dielectric constant is about 3.0. In the case of use of a $Si_3N_4$ film, the dielectric constant is about 9. It is preferable in the practice of this invention to use a material of low dielectric constant in order to lower the electrical capacitance between the interconnects. Ideally, the use of air as an isolation medium is the best because it has a dielectric constant of about 1. However, air is not practical and, therefore, typically a $SiO_2$ film or a polyimide film, whose dielectric constants are fairly low have been employed as a material for encapsulating interconnects 3. When the dielectric constant is about 3 and the interconnect spatial separation, S, is below 1.0 μm, the degree of circuit delay, which is due to an increase in electrical capacitance between adjacent interconnects, becomes larger.

In summary, when the interconnect width is in the submicron range, the circuit operation speed delay brought about an increase of the interconnect capacitance associated with scaling of the interconnect spatial separation is dominant or much larger compared to the increase of interconnect resistance associated with interconnect width scaling. Thus, the increase of circuit delay associated with design rule scaling can be avoided by employing the interconnect layout rule of this invention wherein the interconnect spatial separation comparatively is significantly larger (S > L) than the interconnect width according to the layout rule of this invention.

While the invention has been described in conjunction with a embodiment, it is evident to those skilled in the art that many further alternatives, modifications and variations will be apparent in light of the forgoing description. Thus, the invention described herein is intended to embrace at such alternatives, modifications, applications and variations as fall within the spirit and scope of the appended claims.

What is claimed is:

1. In an integrated circuit structure in the submicron integration scale regime, patterned thin film metal interconnects formed in said structure in a manner to optimize the overall reduction in spatial capacitance between interconnects, said interconnects patterned to have a width, L, equal to or less than 0.8 μm, and having a spatial separation, S, comprising the range of 1.0 μm to 1.2 μm, and having a thickness in the range of 0.1 μm to 1.0 μm with the thickness, $T_{Al}$, of said interconnects being comparatively large to provide a high ratio value of $T_{Al}/L$ with $T_{Al}$ in the range of 0.1 to 1.0 μm providing optimized reduction in interconnect spatial capacitance and resistance resulting in increased operation speed of the integrated circuit structure.

2. In the integrated circuit structure of claim 1 wherein the thickness, $T_{Al}$, of said interconnects is about 0.5 μm.

* * * * *